(12) United States Patent
Skala et al.

(10) Patent No.: US 6,261,939 B1
(45) Date of Patent: Jul. 17, 2001

(54) PAD METALLIZATION OVER ACTIVE CIRCUITRY

(75) Inventors: Stephen L. Skala; Subhas Bothra; Emmanuel Demuizon, all of Fremont, CA (US)

(73) Assignee: Philips Semiconductors, Inc., Tarrytown, NY (US)

( * ) Notice: Subject to any disclaimer, the term of this patent is extended or adjusted under 35 U.S.C. 154(b) by 0 days.

(21) Appl. No.: 09/472,384

(22) Filed: Dec. 23, 1999

(51) Int. Cl.[7] ................................................ H01L 21/44
(52) U.S. Cl. .................... 438/612; 438/123; 438/610; 438/613
(58) Field of Search ................................ 438/612, 613, 438/610, 611, 123, 622, 309

(56) References Cited

U.S. PATENT DOCUMENTS 5,795,818 * 8/1998 Marrs .

OTHER PUBLICATIONS

*Elimination of Bond–Pad Damage Through Structural Reinforcement of Intermetal Dielectrics*, 1998, p. 225.

* cited by examiner

Primary Examiner—Kevin M. Picardat
Assistant Examiner—D. M. Collins

(57) ABSTRACT

Metal bond pads are formed over active circuitry in a semiconductor chip in a reliable and cost effective manner. According to an example embodiment of the present invention, a metal bond pad is formed over circuitry in the semiconductor chip. A metal layer is formed over the circuitry and the metal bond pad, and a photoresist mask is patterned over the metal layer. The metal layer is etched and the portion of the metal layer not masked with the photoresist is removed. In this manner, additional metal can be formed on the pad site using only one additional mask step, and the thicker metal at the pad site improves the reliability of the chip by providing for a metal cushion at the pad useful in subsequent wire bonding processes.

15 Claims, 2 Drawing Sheets

PAD METALLIZATION OVER ACTIVE CIRCUITRY

FIELD OF THE INVENTION

The present invention relates generally to semiconductor devices and their fabrication and, more particularly, to semiconductor devices and their manufacture involving techniques for forming circuitry.

BACKGROUND OF THE INVENTION

The semiconductor industry has recently experienced technological advances that have permitted dramatic increases in circuit density and complexity, and equally dramatic decreases in power consumption and package sizes. These advancements have been accompanied by, and sometimes driven by, an increased demand for faster operation, reduction in cost, and higher reliability of semiconductor devices. The ability to form structures in increasingly smaller areas having increasingly dense circuitry, as well as the ability to place more semiconductor chips on a wafer, are important for meeting these and other needs of advancing technologies.

One aspect of semiconductor manufacture includes the formation of bond pads on a chip. The bond pads are normally placed on the periphery of the semiconductor chip, without underlying circuitry, and are used for subsequent wire bonding to a wafer. However, it is desirable to form bond pads over active circuitry in order to reduce the size of the chip. By reducing the size of the chip, more chips can be bonded to a wafer in a given area.

In such efforts to increase circuit and die densities, semiconductor device manufacture has encountered difficulty in the formation of metal pads over and near circuitry in the device. One such difficulty involves the production of a reliable product. Reliability concerns can prevent the placement of bond pads over active circuitry. For example, existing methods for forming pads over circuitry can produce cracking in underlying inter-metal oxide (IMO) layers. In addition, those methods that meet reliability goals are often too costly to be profitable.

One method for making reliable bond pads over active circuitry includes adding an additional passivation layer of sufficient thickness and an additional metal layer serving as the metal for wire bonding. Both the additional IMO layer and the metal layer should be thick enough to absorb and/or distribute the bonding force in such a way as to not crack the underlying IMO layers. A thickness of 1–2 microns for both the added passivation and metal layer has been found to prevent IMO cracking. However, the addition of a thick passivation layer and a thick metal layer is very costly as two mask steps are required, one for the via etch and one for the metal etch. Moreover, the throughput for the thick layers is low, which reduces the efficiency of the manufacturing process and results in higher product cost.

Obtaining a thick IMO layer has been achieved by leaving one or more metal layers inactive in a multi-metal chip. IMO thickness of greater than 2 microns can easily be realized by leaving one or more metal layers inactive. However, forming thick pad metallization is also desirable, but difficult to achieve, as design rules and processing constraints of the top metal layer typically prohibit making the layer significantly thicker than 1 micron. These and other problems associated with existing methods for bonding over active circuits are impediments to the growth and improvement of semiconductor technologies.

SUMMARY OF THE INVENTION

The present invention is directed the manufacture of a semiconductor device involving the formation of metal bond pads over active circuitry, and is exemplified in a number of implementations and applications, some of which are summarized below.

According to an example embodiment of the present invention, thick metal is formed on a metal bond pad on the circuit side of a semiconductor chip. First, a metal bond pad is formed over circuitry on the circuit side of a semiconductor chip. Next, a metal layer is formed over the circuit side and is masked with a photoresist patterned over the metal layer. The circuit side is then etched and the portion of the metal layer not masked with the photoresist is removed. The remaining photoresist is then removed, leaving thick metal over the metal bond pad.

In another example embodiment of the present invention, a metal bond pad is formed on a semiconductor chip. The metal bond pad has a first metal pad layer, a TiN diffusion layer over the first metal pad layer, and a second metal pad layer over the TiN diffusion layer. A passivation layer is formed over the pad and subsequently etched to expose the second metal pad layer.

In still another example embodiment of the present invention, a system is arranged for manufacturing a semiconductor chip having a metal bond pad over active circuitry. A first metal deposition arrangement is adapted to deposit a metal bond pad on the circuit side, and a second metal deposition arrangement is adapted to deposit a metal layer over the circuit side. After the metal layer is deposited, a photoresist deposition arrangement is adapted to pattern a photoresist mask over the metal layer, and an etching arrangement is adapted to etch the circuit side and remove the portion of the metal layer not masked with the photoresist. When the circuit side has been etched, a photoresist removal arrangement is adapted to remove the photoresist.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which

FIG. 1 is a metal bond pad formed over circuitry;

FIG. 2 is the metal bond pad of FIG. 1 having undergone additional processing;

FIG. 3 is the metal bond pad of FIG. 2 having undergone additional processing;

FIG. 4 is the metal bond pad of FIG. 3 having undergone additional processing;

FIG. 5 is the metal bond pad of FIG. 1 having undergone additional processing; and FIG. 6 is a metal bond pad.

Figure 1:
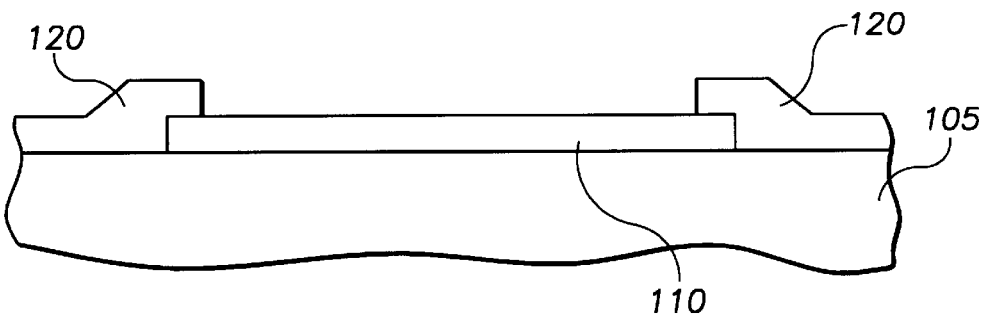
FIGS. 1–6 illustrate various stages of pad/chip manufacture in accordance with example embodiments and aspects of the present invention, more particularly.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for flip-chip and other type devices requiring or benefiting from the formation of metal bond pads over active circuitry. While the present invention is not necessarily limited to such devices, various aspects of the invention may be appreciated through a discussion of various examples using this context.

In connection with an example embodiment of the present invention, a method and system are adapted for forming metal bond pads over active circuitry in a semiconductor chip while maintaining reliability of the chip and doing so in a cost-effective manufacturing process. According to a specific example embodiment of the present invention, a metal layer is formed over a circuit side of a semiconductor chip having a metal bond pad formed over circuitry in the circuit side. A photoresist mask is patterned over the metal layer, and the metal layer is etched. The photoresist is patterned in such a manner so as to mask the metal layer over the metal bond pad, and allow most or all of the remaining metal layer to be etched. Once the metal layer is etched, the photoresist is removed. Various deposition arrangements, etching arrangements including etch chambers, and photoresist deposition arrangements typically available can be used to effect the processes described herein. In this manner, thick metal is formed over the metal bond pad using only one additional etching step, improving the reliability of bonding to metal pads formed over active circuitry. One reliability improvement that can be realized with the present invention is the prevention of the formation of inter-metallic Al/Au during a subsequent wire bonding process.

FIGS. 1–4 show progressive processing steps in the manufacture of a semiconductor chip, according to another specific example embodiment of the present invention. FIG. 1 shows a metal pad 110 formed over the circuit side 105 of a semiconductor chip, a passivation layer 120 formed over a portion of the metal pad 110 and the circuit side 105 using conventional semiconductor chip manufacturing processes. For example, the metal pad 110 may be formed by first depositing a layer of metal, such as aluminum, over the circuit side of the chip, and then patterning a first mask, such as a photoresist mask, over the metal layer. The first photoresist is patterned so that it masks the portion of the metal layer shown as the metal pad 110. After the photoresist is patterned, the chip is etched and the metal pad 110 is left behind. The first photoresist is removed, and a passivation layer is formed over the circuit side of the chip. The passivation layer is then patterned with a second photoresist so that the portion of the passivation layer 120 shown is masked. The chip is then etched and the metal pad 110 is exposed, as shown in FIG. 1.

Figure 2:
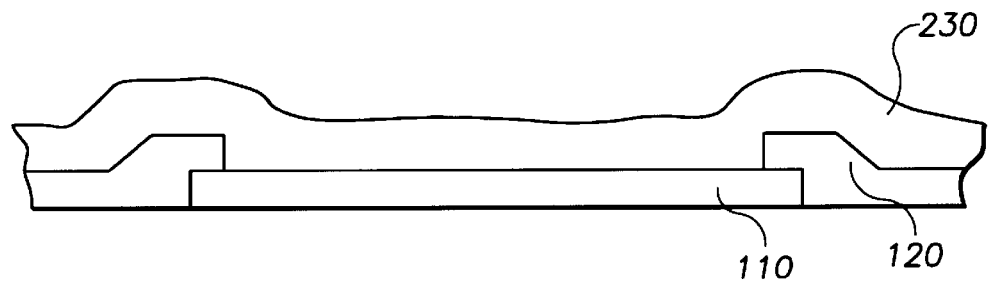
Figure 3:
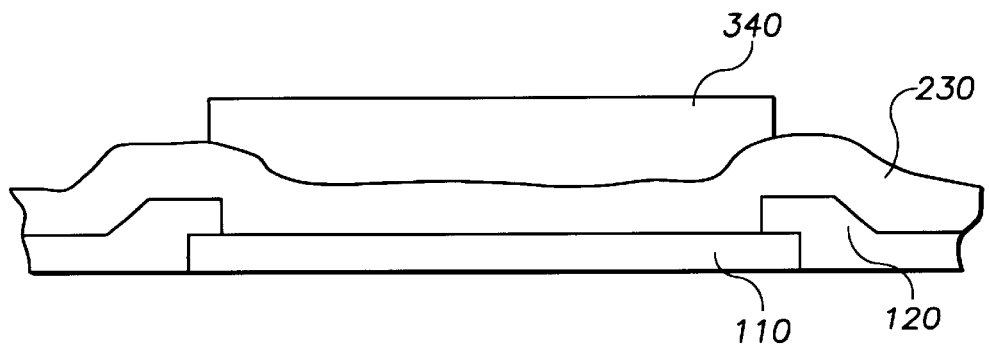
Figure 4:
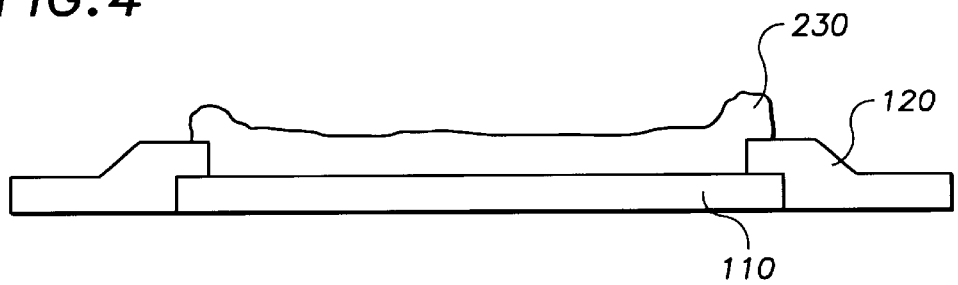

In FIG. 2, a second metal layer 230 is formed over the circuit side of the chip including the metal pad 110 and the passivation 120. The second metal layer 230 may include, for example, aluminum or other suitable bonding material. A photoresist 340 is formed over the metal pad 110 and over the second metal layer 230 as shown in FIG. 3. The photoresist 340 masks the portion of the second metal layer 230 that is over the metal pad 110. After the photoresist 340 is formed, the chip is etched and the portion of the second metal layer 230 remains over the metal pad 110, as shown in FIG. 4. The photoresist 340 is then removed, leaving a thick metal 230 over the metal pad 110.

According to a more particular example embodiment of the present invention, a semiconductor device is manufactured using a flip-chip bonded integrated circuit having a plurality of metal pads formed over active circuitry, wherein the pads are formed having thick metal over the pads in a manner as described in connection with FIGS. 1–4. The flip-chip is wire bonded to a package substrate via the thick metal and the plurality of pads. The metal is thick enough to prevent the formation of inter-metallic Al/Au during the wire bonding process.

Figure 5:
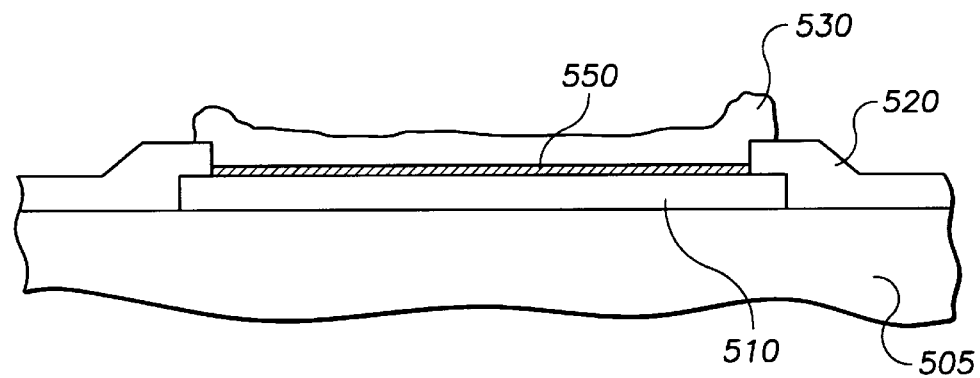

In another example embodiment of the present invention, a metal pad is formed over active circuitry, a diffusion barrier layer including material such TiN is formed over the metal pad, and a second metal layer is formed over the metal pad and over the TiN layer. FIG. 5 shows an example such structure formed on a semiconductor chip. A metal pad 510 and a passivation layer 520 are formed on a chip in a manner such as described in connection with FIG. 1 above. A TiN layer 550 is formed in the exposed region of the passivation 520 and over the metal pad 510. The thickness of the TiN layer is chosen to sufficiently reduce or prevent the formation of inter-metallic Al/Au during a subsequent wire bonding process. In one example implementation, the TiN layer is about 0.5 microns thick, and in another implementation the TiN layer is about 1 micron thick. Once the TiN layer 550 is formed, a second metal layer 530 is formed over the TiN layer. The thickness of the second metal layer 530 is chosen to provide desired characteristics for the particular application that the chip is to be used. In one example application, the second metal layer is about 3 microns thick. The addition of the TiN layer adds benefits including improved reliability of bonding over active circuitry.

The TiN and second metal layers in FIG. 5 may be formed in various manners. For instance, the photoresist mask and subsequent etch process described in connection with FIGS. 1–4 may be used. In one example embodiment, the TiN layer is formed using a conventional photoresist mask and etch process, wherein the photoresist mask is formed on the TiN and the TiN is etched prior to the formation of the second metal layer 530. The second metal layer 530 is then formed over the chip and the TiN layer 550. A photoresist mask is formed over the second metal layer 530 which is then etched to form the patterned metal layer shown in FIG. 5. In another example embodiment, a TiN layer is formed over the circuit side 505 of the chip, and a second metal layer is formed on the TiN layer. A photoresist mask is patterned over the second metal layer and both the second metal layer and the TiN layer are etched using the mask. The resulting structure is shown in FIG. 5.

Figure 6:
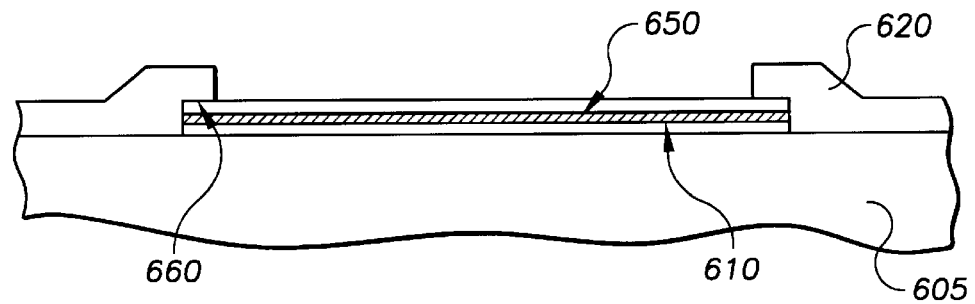

According to another example embodiment of the present invention, a metal bond pad is formed having a diffusion barrier within the pad sufficient to prevent the formation of inter-metallic Al/Au during a subsequent wire bonding process. Referring to FIG. 6, a first pad metal 610 is formed over the circuit side 605 of a semiconductor chip. A TiN diffusion barrier 650 is formed over the first pad metal 610, and a second pad metal 660 is formed over the TiN diffusion barrier 650. In this manner, the metal bond pad is formed having an about normal metal bond pad thickness while maintaining reliability and facilitating the formation of a metal bond pad over active circuitry.

The pad of FIG. 6 may be formed using various mask and etch steps, such as discussed above in connection with FIG. 5. For instance, the first pad metal, the diffusion barrier, and the second pad metal may be formed using individual mask and etch steps for each layer. Alternatively, the mask and etch steps may be performed in combination by masking over and etching two or more layers at the same time.

While the present invention has been described with reference to several particular example embodiments, those skilled in the art will recognize that many changes may be made thereto without departing from the spirit and scope of the present invention, which is set forth in the following claims.

What is claimed is:

1. A method for manufacturing a semiconductor chip having circuitry, the method comprising:

forming a metal bond pad over the circuitry;

forming a metal layer over the circuitry and the metal bond pad;

patterning a photoresist mask over the metal layer; and etching the metal layer and removing the portion of the metal layer not masked with the photoresist.

2. The method of claim 1, further comprising forming a diffusion barrier over the metal bond pad prior to forming the metal layer.

3. The method of claim 2, wherein the diffusion barrier includes TiN.

4. The method of claim 2, wherein forming a diffusion barrier over the metal bond pad includes forming a diffuision barrier layer over and extending beyond the metal bond pad, and wherein etching the metal layer includes removing the portion of the diffusion barrier layer not masked with the photoresist.

5. The method of claim 3, wherein forming a diffusion barrier over the metal bond pad includes forming a diffusion barrier layer over and extending beyond the metal bond pad and, prior to forming the metal layer over the circuit side, the method further comprising:

patterning a photoresist mask over the diffusion barrier layer;

etching the diffusion barrier and removing the portion of the diffusion barrier layer not masked with the photoresist; and removing the photoresist mask.

6. The method of claim 1, wherein patterning a photoresist mask includes depositing photoresist material over the bond pad, and wherein etching the metal layer and removing the portion of the metal layer not masked with the photoresist includes removing the portion of the metal layer not over the bond pad.

7. The method of claim 1, wherein forming a metal bond pad includes forming a plurality of metal bond pads.

8. The method of claim 7, wherein patterning a photoresist mask includes depositing photoresist material over the plurality of bond pads, and wherein etching the metal layer and removing the portion of the metal layer not masked with the photoresist includes removing the portion of the metal layer not over the bond pads.

9. The method of claim 1, wherein the metal bond pad includes aluminum.

10. The method of claim 1, wherein the metal bond pad and the metal layer include the same type of metal.

11. The method of claim 1, wherein the metal layer over the bond pad is of sufficient thickness to prevent the formation of inter-metallic Al/Au during a subsequent wire bonding process.

12. The method of claim 2, wherein the diffusion barrier layer is of sufficient thickness to prevent the formation of inter-metallic Al/Au during a subsequent wire bonding process.

13. A method of manufacturing a semiconductor chip, the method comprising:

forming a pad having a first metal pad layer, a diffusion barrier layer over the first metal pad layer, and a second metal pad layer over the diffusion barrier;

forming a passivation layer over the pad; and etching the passivation layer and exposing the second metal pad layer.

14. The method of claim 13, wherein forming a pad further comprises:

patterning a photoresist mask layer over the second metal pad layer;

etching the portion of the pad not masked with the photoresist; and removing the photoresist mask.

15. The method of claim 13, further comprising forming a photoresist mask layer over the passivation layer prior to etching the passivation layer, wherein the photoresist mask layer is not formed over the portion of the passivation layer that is over the pad.

* * * * *

UNITED STATES PATENT AND TRADEMARK OFFICE
CERTIFICATE OF CORRECTION

PATENT NO.   : 6,261,939 B1
DATED        : July 17, 2001
INVENTOR(S)  : Skala et al.

It is certified that error appears in the above-identified patent and that said Letters Patent is hereby corrected as shown below:

Column 5,
Line 21, "diffuision" should read -- diffusion --.

Signed and Sealed this

Eleventh Day of June, 2002

Attest:

Attesting Officer

JAMES E. ROGAN
Director of the United States Patent and Trademark Office